United States Patent [19]

Oliver

[11] Patent Number: 4,549,150
[45] Date of Patent: Oct. 22, 1985

[54] PUSH PULL OUTPUT RC OSCILLATOR WITH FREQUENCY COMPENSATION

[75] Inventor: Arthur B. Oliver, Houston, Tex.

[73] Assignee: Texas Instruments Incorporated, Dallas, Tex.

[21] Appl. No.: 439,162

[22] Filed: Nov. 4, 1982

[51] Int. Cl.[4] .............................................. H03L 1/00
[52] U.S. Cl. ............................ 331/111; 331/175/176
[58] Field of Search ...................... 331/111, 175, 176

[56] References Cited

U.S. PATENT DOCUMENTS

| | | | |
|---|---|---|---|
| 3,886,485 | 5/1975 | Takahashi | 331/111 |
| 3,995,232 | 11/1976 | Laugesen | 331/111 |
| 4,001,721 | 1/1977 | Fukuda | 331/176 X |
| 4,015,219 | 3/1977 | Kawagoe et al. | 331/176 X |
| 4,161,703 | 7/1979 | Nutz | 331/175 X |
| 4,260,959 | 4/1981 | Allgood | 331/175 X |
| 4,357,581 | 11/1982 | Higuchi | 331/111 |

Primary Examiner—Eugene R. LaRoche
Assistant Examiner—D. C. Mis
Attorney, Agent, or Firm—Robert D. Marshall, Jr.; N. Rhys Merrett; Melvin Sharp

[57] ABSTRACT

An oscillator circuit including a Schmidt trigger that receives an input signal and is connected to a compensating circuit to adjust the trigger points of the Schmidt trigger. The ouput of the Schmidt trigger is connected to a push-pull driver which provides the oscillator output. The oscillator output is fed back through an external resistor and capacitor and input of the Schmidt trigger.

3 Claims, 1 Drawing Figure

PUSH PULL OUTPUT RC OSCILLATOR WITH FREQUENCY COMPENSATION

BACKGROUND OF THE INVENTION

1. Field of the Invention

This invention relates to oscillator circuitry and more specifically to oscillators structured to compensate for supply voltage and transistor parameter variations.

2. Description of the Prior Art

In the past oscillator circuits have been used for many purposes. The present invention is intended for use with microcomputer and microprocessor circuits to produce the clock signals that govern the execution of operations between the microprocessor and microcomputer. The oscillators designed for microcomputers/microprocessors in the past have been implemented with metal oxide silicon field effect transistors (MOSFETS) on the chip themselves. Certain oscillators have required external excitation while others do not have such a requirement. The present invention does require an external resistor and capacitor connection.

In previous microcomputer/microprocessor oscillator circuits, a depletion transistor has been connected to a voltage supply and an enhancement transistor is connected to this depletion transistor to pull the depletion device down to generate an oscillating output pulse. When this enhancement transistor is turned on there is a large current through the depletion device. When the oscillator is to provide a high frequency, this depletion device must be quite large. In a microcomputer/microprocessor circuit this oscillator circuit would require a disproportionately large amount of power and area.

The microcomputer/microprocessor oscillators in the prior art also have problems with frequency stability in the presence of varying transistor characteristics, supply voltage and temperatures. The external devices connected to the oscillator circuit to control the frequency of the oscillator circuit may be adjusted for each individual circuit to compensate for variations in the transistor characteristics and even the power supply voltage. However these adjustments do not compensate for variations in temperature. Since this oscillator frequency directly controls the rate of execution of operations in the microcomputer/microprocessor itself, a frequency that is too high will cause the microcomputer/microprocessor to fail (i.e. to exceed the operational frequency design limits).

It is the object of the present invention to provide an oscillator circuit for a microcomputer/microprocessor that provides frequency stability by compensating for variations in transistor characteristics, variations in supply voltage and variations in temperature.

SUMMARY OF THE INVENTION

In accordance with the present invention an oscillator circuit is provided that includes a Schmidt trigger that receives an input signal. The Schmidt trigger is connected to compensating circuitry. The compensating circuitry varies the trigger points of the Schmidt trigger. The output of the Schmidt trigger is connected to a push-pull driver that provides an oscillating output. The oscillating output is output from the push-pull driver through an external timing circuit and looped back into the Schmidt trigger as the input signal.

In an embodiment of the present invention an oscillator circuit is provided that includes a Schmidt trigger connected to compensating circuitry that varies the trigger points of the Schmidt trigger to compensate for variations in supply voltage and threshold voltages of the transistors in the circuit. The output of the Schmidt trigger is input to a push-pull driver that includes two inverter stages to provide the activating signals for each side of the push-pull driver. The output of the push-pull driver is connected to an external timing circuit. In a further embodiment this external timing circuit includes a resistor and capacitor. The output of this timing circuit is looped back into the input of the schmidt trigger.

BRIEF DESCRIPTION OF THE DRAWING

The novel features believed characteristic of the invention are set forth in the claims. The invention itself, however, as well as other features and advantages thereof will be best understood by reference to the detailed description which follows when read in conjunction with the accompanying drawing, wherein:

DESCRIPTION OF THE PREFERRED EMBODIMENT

Figure 1:
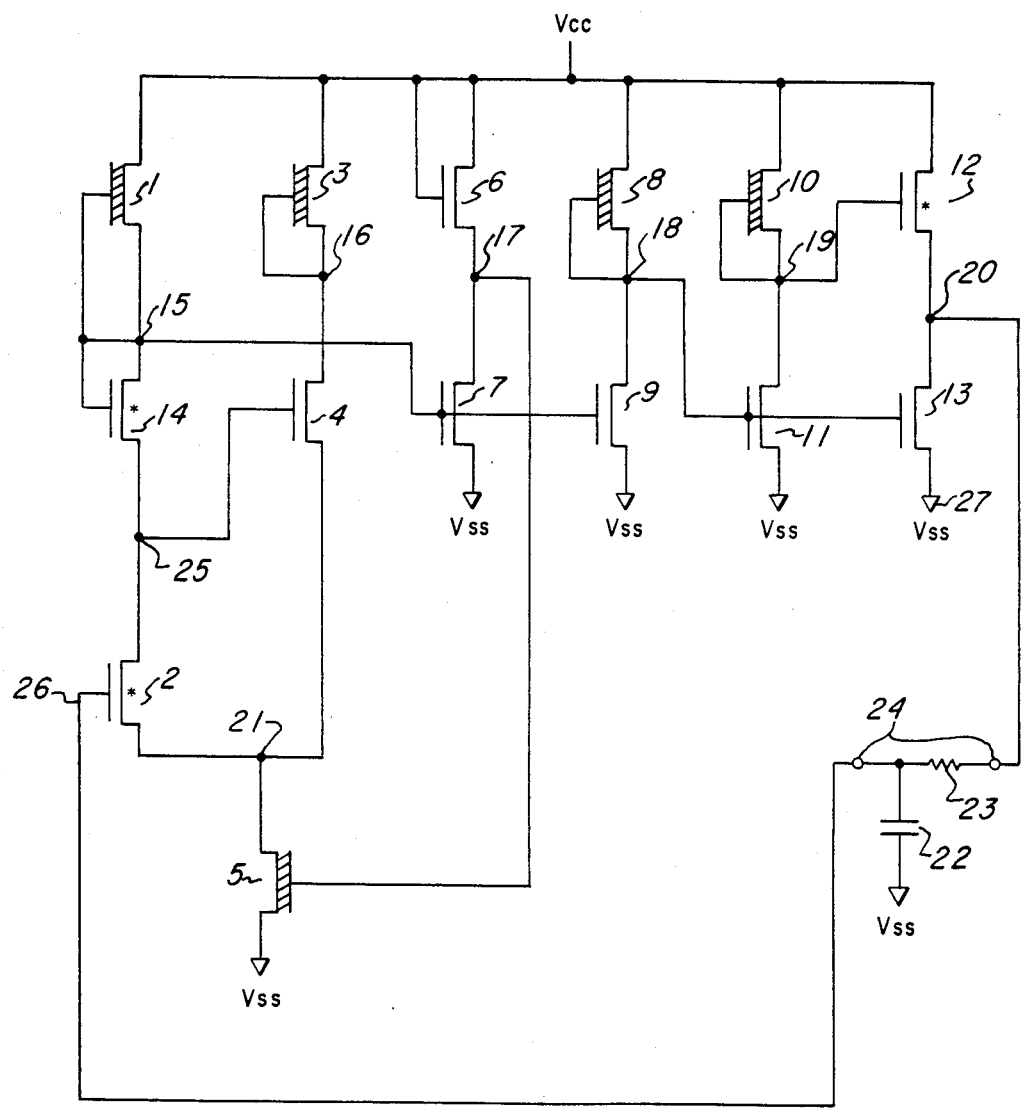
FIG. 1 is a schematic diagram of the oscillator circuit.

The present invention is an oscillator circuit fabricated with MOSFET transistors that connect to an external resistor capacitor combination. Referring to FIG. 1 the MOSFET circuit shown is to be implemented on an integrated circuit with the microcomputer/microprocessor. Resistor 23 and capacitor 22 are external to the integrated circuit and are attached to the integrated circuit at terminals 24. The input to the integrated circuit is the input to transistor 2 node 26. The asterisk adjacent to transistor and adjacent to the other transistors in FIG. 1 designate those transistor as natural transistors (i.e. there is no additional doping of the channel between source and drain). The output of the oscillator is node 20. The oscillator includes a Schmidt trigger. The Schmidt trigger includes transistors 1, 2, 3, 4 and 5. Transistors 1, 3 and 5 are depleted transistors. Transistor 5 receives a feedback signal from node 17 which is the inverse of the voltage on node 15. When node 26 is a 0, node 25 is a 1 providing an input to transistor 4 which is turned on to provide a voltage at node 21. Node 15 is high since transistor 2 is in an off state and node 15 provides an input to transistor 7 which through the inverter circuitry of transistors 6 and 7 node 17 turn off transistor 5. Therefore there is a voltage at node 21. When the input 26 begins to rise to a 1 the voltage to turn on transistor 2 must be at least the transistor threshold voltage higher than the voltage existing at node 21 to turn on transistor 2. When transistor 2 turns on node 25 goes to 0 turning off transistor 4 thus causing node 16 to go high. Node 15 drops causing transistor 7 to turn off and thus causing transistor 5 via node 17 to turn on. The result is that the voltage at node 21 decreases. The circuitry in FIG. 1 provides for a Schmidt trigger that includes varying turn on and turn off points or trigger points. This characteristic is used to provide frequency stabilization. For example if the supply voltage $V_{cc}$ increases, the frequency of the oscillator circuit would normally increase. However in the present invention the increase of the supply voltage $V_{cc}$ will cause the turn on and turn off points of the Schmidt trigger to become further apart. Since the input 26 would then have to travel for a longer time to turn on the circuitry and then travel a longer time to turn off the circuitry, the widening of the Schmidt trigger points serves to decrease the resulting frequency from the oscillator and to stabilize the frequency in the presence of the varying $V_{cc}$. Referring to FIG. 1 transistors 14 and 4 determine the high limits of the Schmidt trigger. A change in the threshold voltage of the transistors will alter the high trigger point of the Schmidt trigger. On the other hand transistors 5 and 6 determine the low trigger point of the Schmidt trigger. Changes in $V_{cc}$ will result in changes in trigger points of the Schmidt trigger by changing the voltage at point 17 and thus changing the voltage at point 21 through transistor 5. The output of the Schmidt trigger point 15 is input to transistor 9 which also provides an inverted input via node 18 to transistor 11 and transistor 13 of the push-pull driver circuit. Point 27 for transistor 13 is Vss and is the same for transistors 5, 7, 9 and 11 and capacitor 21. Transistor 10 is used with transistor 11 to invert the voltage on node 18 and provide an input to the other half of the push-pull circuit, transistor 12. The output of the oscillator 20 is then fed back through the resistor 23 and capacitor 22 circuit to the Schmidt trigger at point 26 as previously discussed.

Transistors 1, 3, 8 and 10 are depletion transistors in order to place $V_{cc}$ on nodes 15, 16, 18 and 19 respectively. Transistors 6 and 7 form a saturated enhancement inverter to introduce a Vt drop (i.e. $V_{cc}$-Vt) at node 17 to perform frequency compensation. This frequency compensation results from raising the low end voltage on node 21 as the $V_t$ of the transistors increase, narrowing the Schmidt trigger trip window. This keeps the oscillator circuitry from slowing down due to the higher Vt by causing the voltage on node 20 to decrease which results in a slower voltage rise on node 26.

What is claimed:
1. An oscillator circuit comprising:
a Schmidt trigger circuit connected to receive an input signal and generating an output;
a push-pull driver circuit receiving said output of said Schmidt trigger circuit for providing an output signal for said oscillator circuit;
an external timing circuit connected to said Schmidt trigger circuit and said push-pull driver circuit for receiving said output signal and providing said input signal;
a first compensating means connected to said Schmidt trigger circuit for determining the low voltage trigger point of said Schmidt trigger circuit, lowering the low voltage trigger point of said Schmidt trigger circuit in response to an increase in the supply voltage and vice versa; and
a second compensating means connected to said Schmidt trigger circuit for determining the high voltage trigger point of said Schmidt trigger circuit, raising the high voltage trigger point of said Schmidt trigger circuit in response an increase in the supply voltage and vice versa, whereby the frequency of oscillation of said oscillator circuit is stabalized with respect to variations in supply voltage.

2. An oscillator circuit as claimed in claim 1, further comprising:
a first inverter circuit having an input connected to said Schmidt trigger circuit output and a first inverter output;
a second inverter circuit having an input connected to said first inverter output and a second inverter output;
said push-pull driver circuit includes a first driver means connected to said first inverter output and a second driver means connected to said second inverter output, whereby said push-pull driver circuit is connected to said Schmidt trigger circuit via said first and second inverter circuits.

3. An oscillator circuit as claimed in claim 1, wherein:
said Schmidt trigger circuit comprises metal oxide field effect devices including at least one enhancement type field effect device, at least one depletion type field effect device and at least one natural field effect device;
said first compensating means comprises a metal oxide field effect device of the enhancement type; and
said second compensating means comprises a metal oxide field effect device of the natural type.

* * * * *